United States Patent
Tsai et al.

(10) Patent No.: US 9,263,380 B2
(45) Date of Patent: Feb. 16, 2016

(54) SEMICONDUCTOR INTERPOSER AND PACKAGE STRUCTURE HAVING THE SAME

(71) Applicant: Siliconware Precision Industries Co., Ltd., Taichung (TW)

(72) Inventors: Jyun-Ling Tsai, Taichung (TW); Chang-Lun Lu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/515,970

(22) Filed: Oct. 16, 2014

(65) Prior Publication Data
US 2015/0303138 A1 Oct. 22, 2015

(30) Foreign Application Priority Data
Apr. 22, 2014 (TW) .............................. 103114465 A

(51) Int. Cl.
*H01L 23/12* (2006.01)
*H01L 23/498* (2006.01)
*H01L 23/00* (2006.01)
*H01L 23/31* (2006.01)

(52) U.S. Cl.
CPC ...... *H01L 23/49838* (2013.01); *H01L 23/3171* (2013.01); *H01L 23/49811* (2013.01); *H01L 24/17* (2013.01); *H01L 2224/16113* (2013.01); *H01L 2224/16227* (2013.01)

(58) Field of Classification Search
CPC ................ H01L 25/0657; H01L 24/03; H01L 2224/1308; H01L 24/14; H01L 2225/06513; H01L 21/486; H01L 21/568
USPC .......................................................... 257/704
See application file for complete search history.

(56) References Cited

U.S. PATENT DOCUMENTS

| | | | |
|---|---|---|---|
| 2008/0315372 A1* | 12/2008 | Kuan et al. ..................... | 257/659 |
| 2010/0044882 A1* | 2/2010 | Park et al. ............. | H01L 21/563 257/778 |
| 2012/0061823 A1* | 3/2012 | Wu et al. ........................ | 257/737 |
| 2012/0261662 A1* | 10/2012 | Liang et al. .................... | 257/48 |
| 2013/0134559 A1* | 5/2013 | Lin et al. ........... | H01L 23/49827 257/620 |
| 2013/0134582 A1* | 5/2013 | Yu et al. ........................ | 257/737 |

* cited by examiner

*Primary Examiner* — Tod T Van Roy
*Assistant Examiner* — Vu A Vu
(74) *Attorney, Agent, or Firm* — Mintz Levin Cohn Ferris Glovsky and Popeo, P.C.; Peter F. Corless; Steven M. Jensen

(57) ABSTRACT

A semiconductor interposer is provided, which includes: a substrate body having a surface defined with an inner area and a peripheral area around the inner area; a plurality of conductive posts embedded in the substrate body and each having one end exposed from the surface of the substrate body; a passivation layer formed on the surface of the substrate body and having a peripheral portion formed in the peripheral area, a plurality of ring-shaped portions formed around peripheries of the exposed ends of the conductive posts in the inner area and a plurality of strip-shaped portions formed between the ring-shaped portions for connecting the ring-shaped portions; and a UBM layer formed on the exposed end of each of the conductive posts and extending on the ring-shaped portion around the periphery of the exposed end of the conductive post, thereby effectively reducing stresses to prevent warping of the semiconductor interposer.

27 Claims, 5 Drawing Sheets

SEMICONDUCTOR INTERPOSER AND PACKAGE STRUCTURE HAVING THE SAME

CROSS-REFERENCES TO RELATED APPLICATIONS

This application claims under 35 U.S.C. §119(a) the benefit of Taiwanese Application No. 103114465, filed Apr. 22, 2014, the entire contents of which is incorporated herein by reference.

BACKGROUND OF THE INVENTION

1. Field of the Invention

The present invention relates to semiconductor interposers and package structures having the same, and more particularly, to a semiconductor interposer having a UBM (Under Bump Metallurgy) layer and a package structure having the semiconductor interposer.

2. Description of Related Art

Flip-chip technologies facilitate to reduce chip packaging sizes and shorten signal transmission paths and therefore have been widely used for chip packaging. Various types of packages such as chip scale packages (CSPs), direct chip attached (DCA) packages and multi-chip module (MCM) packages can be achieved through flip-chip technologies.

In a flip-chip packaging process, a big CTE (Coefficient of Thermal Expansion) mismatch between a chip and a packaging substrate adversely affects the formation of joints between conductive bumps of the chip and contacts of the packaging substrate, thus easily resulting in delamination of the conductive bumps from the packaging substrate. On the other hand, along with increased integration of integrated circuits, the CIE mismatch between the chip and the packaging substrate induces more thermal stresses and leads to more serious warpage, thereby reducing the product reliability and resulting in failure of a reliability test.

Accordingly, a silicon interposer is disposed between the packaging substrate and the semiconductor chip. Since the silicon interposer is close in material to the semiconductor chip, the above-described drawbacks caused by a CTE mismatch can be effectively overcome.

FIG. 1 is a schematic cross-sectional view of a conventional package structure having a silicon interposer. Such a package structure overcomes the above-described drawbacks. In addition, compared with a package structure having a semiconductor chip directly disposed on a packaging substrate, the package structure of FIG. 1 has a reduced layout area.

For example, a packaging substrate generally has a minimum line width/pitch of 12/12 um. When the I/O count of a semiconductor chip increases, since the line width/pitch of the packaging substrate cannot be reduced, the area of the packaging substrate must be increased such that more circuits can be formed on the packaging substrate and electrically connected to the semiconductor chip having high I/O count. On the other hand, referring to FIG. 1, a plurality of semiconductor chips 11 are disposed on a silicon interposer 12 having through silicon vias (TSVs) and the silicon interposer 12 is further disposed on a packaging substrate 13. As such, the semiconductor chips 11 are electrically connected to the packaging substrate 13 through the silicon interposer 12. Through a semiconductor process, the silicon interposer 12 can have a line width/pitch of 3/3 um or less. Therefore, the semiconductor chips 11 having high I/O counts can be disposed on the through silicon interposer 2 without the need to increase the area of the packaging substrate 13. Further, the fine line width/pitch of the silicon interposer 12 facilitates to shorten the electrical transmission path. Therefore, compared with semiconductor chips directly disposed on a packaging substrate, the semiconductor chips 11 disposed on the silicon interposer 12 can achieve a higher electrical transmission speed (efficiency).

To meet the miniaturization requirement of electronic products, the silicon interposer 12 of the above-described package structure is becoming lighter, thinner, shorter and smaller. Generally, the silicon interposer 12 has a thickness below 100 um, for example, in a range of 50 to 100 um. However, such a small thickness easily leads to warping of the silicon interposer 12 during fabrication of the silicon interposer 12, when the semiconductor chips 11 are disposed on the silicon interposer 12 or when the silicon interposer 12 is disposed on the packaging substrate 13, thereby generating large stresses on conductive elements 14 (such as u-bumps) between the semiconductor chips 11 and the silicon interposer 12 or conductive elements 15 (such as c4 bumps) between the silicon interposer 12 and the packaging substrate 13 and hence easily causing cracking of the joints.

Particularly, serious cracking often occurs to the conductive elements 14. In addition, when processes such as chip mounting processes or heating processes are performed after singulation of the silicon interposer 12, large stresses easily occur around a periphery of the silicon interposer 12, which easily cause warping of the silicon interposer 12 and consequently reduce the reliability of final products.

Therefore, how to overcome the above-described drawbacks has become critical.

SUMMARY OF THE INVENTION

In view of the above-described drawbacks, the present invention provides a semiconductor interposer, which comprises: a substrate body having opposite first and second surfaces, wherein an inner area and a peripheral area around the inner area are defined on the second surface of the substrate body; a plurality of conductive posts embedded in the substrate body and each having one end exposed from the second surface of the substrate body; a passivation layer formed on the second surface of the substrate body, wherein the passivation layer has a peripheral portion formed in the peripheral area of the substrate body, a plurality of ring-shaped portions formed around peripheries of the exposed ends of the conductive posts in the inner area of the substrate body and a plurality of strip-shaped portions formed between the ring-shaped portions for connecting the ring-shaped portions; and a UBM layer formed on the exposed end of each of the conductive posts and extending onto the ring-shaped portion around the periphery of the exposed end of the conductive post.

In the above-described semiconductor interposer, the number of the strip-shaped portions of the passivation layer can be 2(n+1) such that the strip-shaped portions are arranged into a plurality of polygons. Therein, n is a positive integer greater than zero. The polygons can have a same size. The polygons can be in connection with one another to form a mesh pattern. Adjacent polygons can only share one ring-shaped portion such that the polygons are connected in series. The polygons can be arranged in an alternate staggering pattern. The strip-shaped portions can be arranged into a plurality of regular hexagons, and each of the regular hexagons can be comprised of at least six of the strip-shaped portions. Further, n can be in a range of 1 to 20.

The above-described semiconductor interposer can further comprise a surface passivation layer formed on the second surface of the substrate body and positioned between the passivation layer and the substrate body. The surface passivation layer can be formed on the entire second surface of the substrate body and a portion of the surface passivation layer around the periphery of the exposed end of each of the conductive posts can be exposed from the ring-shaped portion of the passivation layer such that the UBM layer is further formed on the exposed portion of the surface passivation layer. The surface passivation layer can be made of an inorganic material.

In the above-described semiconductor interposer, the passivation layer can be made of a polymer material. An outer edge of the ring-shaped portion can extend 8 to 12 um beyond an outer edge of the UBM layer on the ring-shaped portion.

The present invention further provides a package structure, which comprises: a semiconductor interposer, comprising: a substrate body having opposite first and second surfaces, wherein an inner area and a peripheral area around the inner area are defined on the second surface of the substrate body; a plurality of conductive posts embedded in the substrate body and each having one end exposed from the second surface of the substrate body; a passivation layer formed on the second surface of the substrate body, wherein the passivation layer has a peripheral portion formed in the peripheral area of the substrate body, a plurality of ring-shaped portions formed around peripheries of the exposed ends of the conductive posts in the inner area of the substrate body and a plurality of strip-shaped portions formed between the ring-shaped portions for connecting the ring-shaped portions; and a UBM layer formed on the exposed end of each of the conductive posts and extending onto the ring-shaped portion around the periphery of the exposed end of the conductive post; a first electronic element disposed on the first surface of the substrate body; and a second electronic element disposed on the second surface of the substrate body through the UBM layer.

In the above-described package structure, the first electronic element can be a chip and the second electronic element can be a carrier. The number of the strip-shaped portions of the passivation layer can be 2(n+1) such that the strip-shaped portions are arranged into a plurality of polygons. Therein, n is a positive integer greater than zero. The polygons can have a same size. Further, n can be in a range of 1 to 20. The polygons can be in connection with one another to form a mesh pattern. Adjacent polygons can only share one ring-shaped portion such that the polygons are connected in series. The polygons can be arranged in an alternate staggering pattern. The strip-shaped portions can be arranged into a plurality of regular hexagons, and each of the regular hexagons can be comprised of at least six of the strip-shaped portions.

The above-described package structure can further comprise a surface passivation layer formed on the second surface of the substrate body and positioned between the passivation layer and the substrate body. The surface passivation layer can be formed on the entire second surface of the substrate body and a portion of the surface passivation layer around the periphery of the exposed end of each of the conductive posts can be exposed from the ring-shaped portion of the passivation layer such that the UBM layer is further formed on the exposed portion of the surface passivation layer. The surface passivation layer can be made of an inorganic material.

In the above-described package structure, the passivation layer can be made of a polymer material. An outer edge of the ring-shaped portion can extend 8 to 12 um beyond an outer edge of the UBM layer on the ring-shaped portion.

According to the present invention, the peripheral portion of the passivation layer is formed in the peripheral area of the semiconductor interposer that generally experiences large stresses and the ring-shaped portions and the strip-shaped portions of the passivation layer are formed in the inner area of the semiconductor interposer that generally experiences small stresses. As such, the present invention effectively reduces stresses so as to prevent warping of the semiconductor interposer. Also, the present invention avoids delamination of the UBM layer or cracking of a conductive element on the UBM layer.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "on", "a" etc. are merely for illustrative purposes and should not be construed to limit the scope of the present invention.

Figure 1:
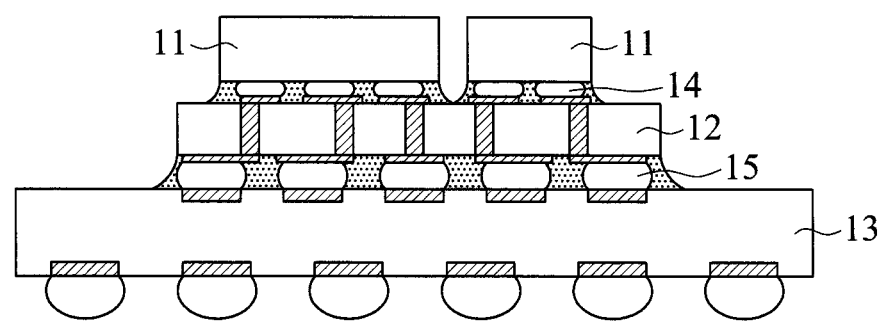
FIG. 1 is a schematic cross-sectional view of a conventional package structure having a silicon interposer.
Figure 2A:
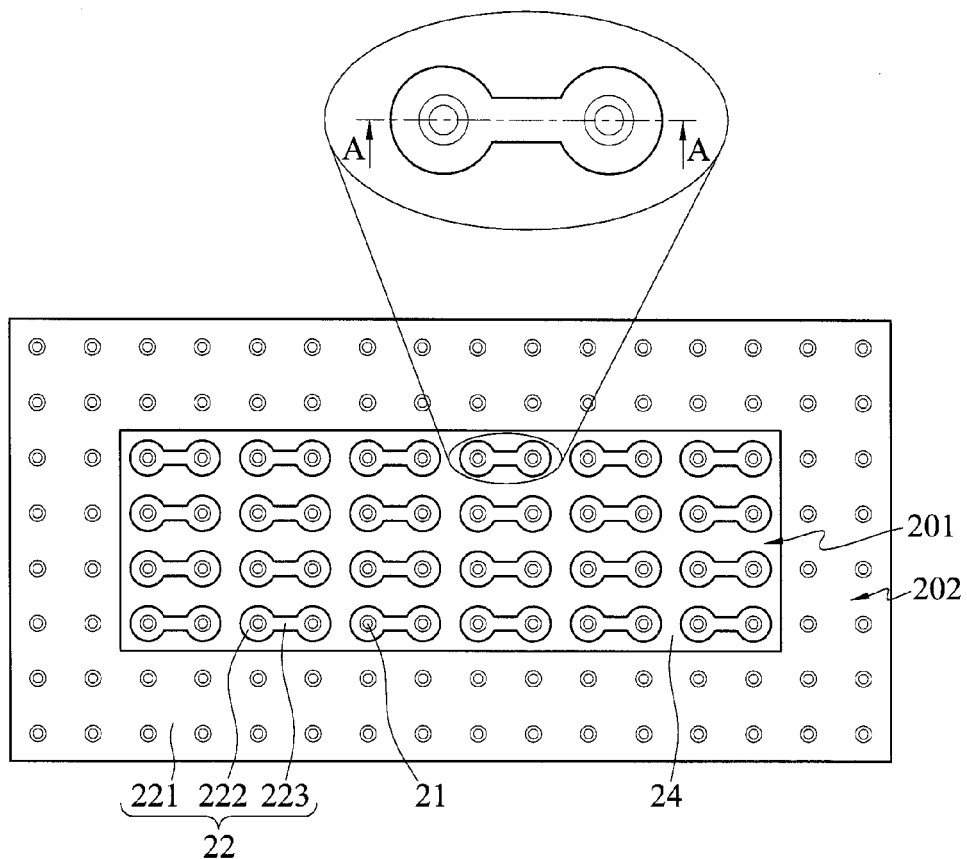
FIG. 2A is a schematic top view of a semiconductor interposer of the present invention.
Figure 2B:
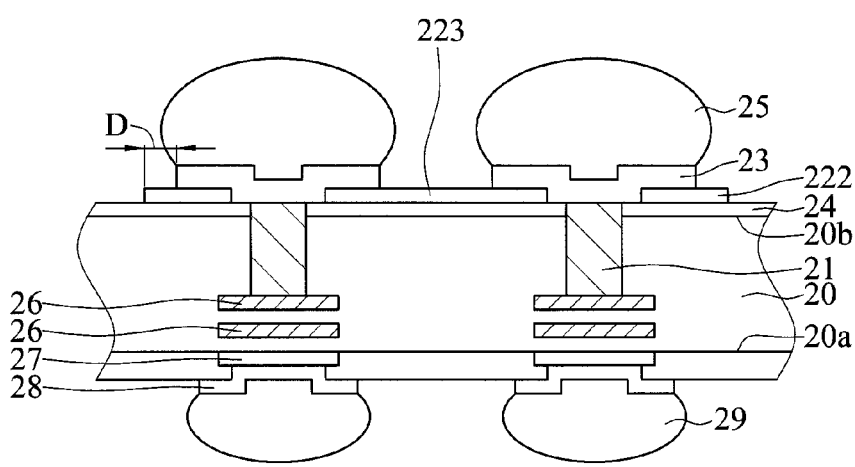
FIG. 2B is a partially cross-sectional view of the semiconductor interposer along a sectional line AA of FIG. 2A.

FIG. 2A is a schematic top view of a semiconductor interposer of the present invention, and FIG. 2B is a partially cross-sectional view of the semiconductor interposer along a sectional line AA of FIG. 2A. Referring to FIGS. 2A and 2B, the semiconductor interposer of the present invention has a substrate body 20 having opposite first and second surfaces 20a, 20b. The second surface 20b of the substrate body 20 has an inner area 201 and a peripheral area 202 around the inner area 201 defined thereon. A plurality of conductive posts 21 are embedded in the substrate body 20 and each of the conductive posts 21 has one end exposed from the second surface 20b of the substrate body 20. A passivation layer 22 is formed on the second surface 20b of the substrate body 20. The passivation layer 22 has a peripheral portion 221 formed in the peripheral area 202, a plurality of ring-shaped portions 222 formed around peripheries of the exposed ends of the conductive posts 21 in the inner area 201 of the substrate body 20 and a plurality of strip-shaped portions 223 formed between the ring-shaped portions 222 for connecting the ring-shaped portions 222. The passivation layer 22 can be formed through a patterning process (for example, exposure and development) and made of a polymer material. A UBM layer 23 (only shown in FIG. 2B) is formed on the exposed end of each of the conductive posts 21 and extends on the ring-shaped portion 222 around the periphery of the exposed end of the conductive post 21.

Further, a surface passivation layer 24 can be formed on the second surface 20b of the substrate body 20 and positioned between the passivation layer 22 and the substrate body 20.

The surface passivation layer 24 can be made of an inorganic material, for example, $Si_3N_4$ (or $Si_xN_y$) or $SiO_2$ (or $Si_xO_y$). In particular, the surface passivation layer 24 can be formed on the entire second surface 20b of the substrate body 20, and a portion of the surface passivation layer 24 around the periphery of the exposed end of each of the conductive posts 21 is exposed from the ring-shaped portion 222 of the passivation layer 22. Further, the UBM layer 23 is formed on the exposed portion of the surface passivation layer 24.

In the present embodiment, an outer edge of the ring-shaped portion 222 extends a distance D of 8 to 12 um beyond an outer edge of the UBM layer 23 on the ring-shaped portion 222.

Referring to FIG. 2B, a conductive element 25 is further formed on the UBM layer 23. The conductive posts 21 can further be electrically connected to conductive pads 27, UBM layers 28 and conductive elements 29 on the first surface 20a of the substrate body 20 through a plurality of circuit layers 26 in the substrate body 20.

FIGS. 3A to 3E show different embodiments of the inner area of FIG. 2A.

Figure 3A:
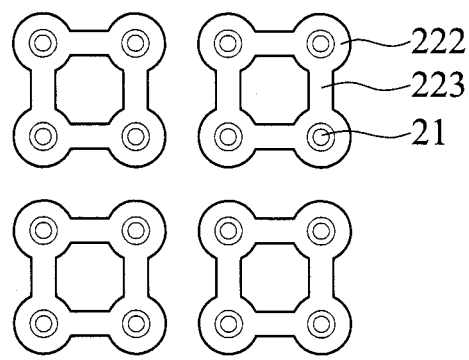
FIGS. 3A to 3E are schematic views showing different embodiments of an inner area of FIG. 2A.
Figure 3B:
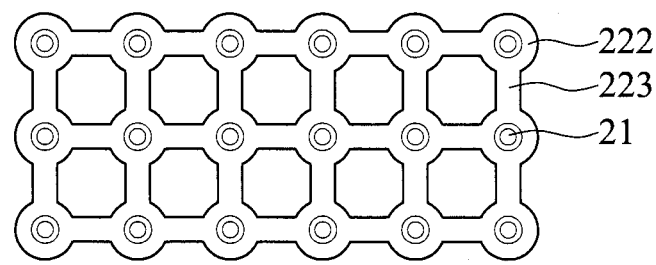
Figure 3C:
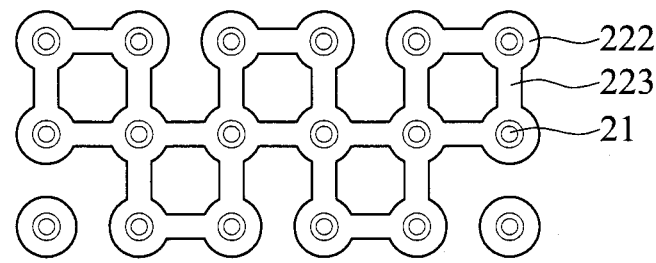

Referring to FIG. 3A, the number of the strip-shaped portions 223 is 2(n+1) and the strip-shaped portions 223 are arranged into a plurality of polygons. Therein, n is a positive integer greater than zero. For example, n is in a range of 1 and 20. Referring to FIGS. 3A to 3C, the strip-shaped portions 223 connect adjacent four ring-shaped portions 222 so as to form a plurality of regular polygons, for example, squares. The squares have a same size.

Referring to FIG. 3B, the squares are in connection with one another to form a mesh pattern.

Referring to FIG. 3C, adjacent squares only share one ring-shaped portion 222. As such, the squares are connected in series. Further, the squares are arranged in an alternate staggering pattern.

Figure 3D:
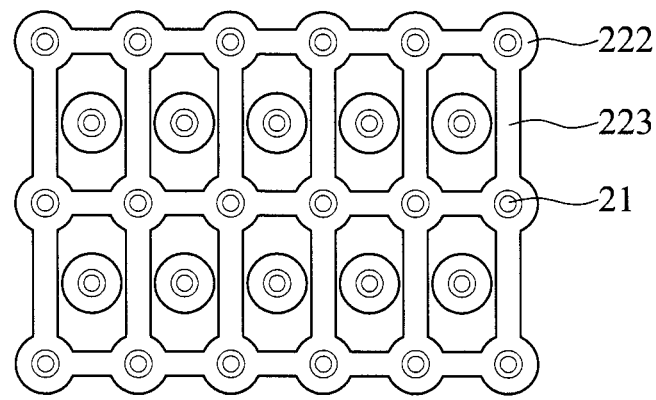

Referring to FIG. 3D, the polygons are rectangles and each of the rectangles surrounds a conductive post 21.

Figure 3E:
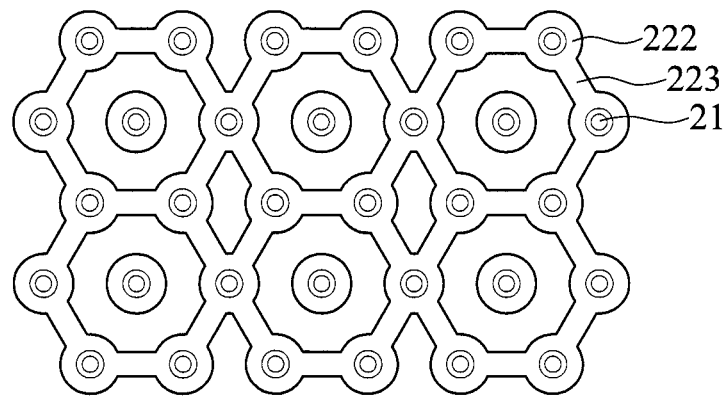

Referring to FIG. 3E, the strip-shaped portions 223 are arranged into a plurality of regular hexagons. Each of the hexagons consists of at least six strip-shaped portions 223 and surrounds a conductive post 21.

Figure 4:
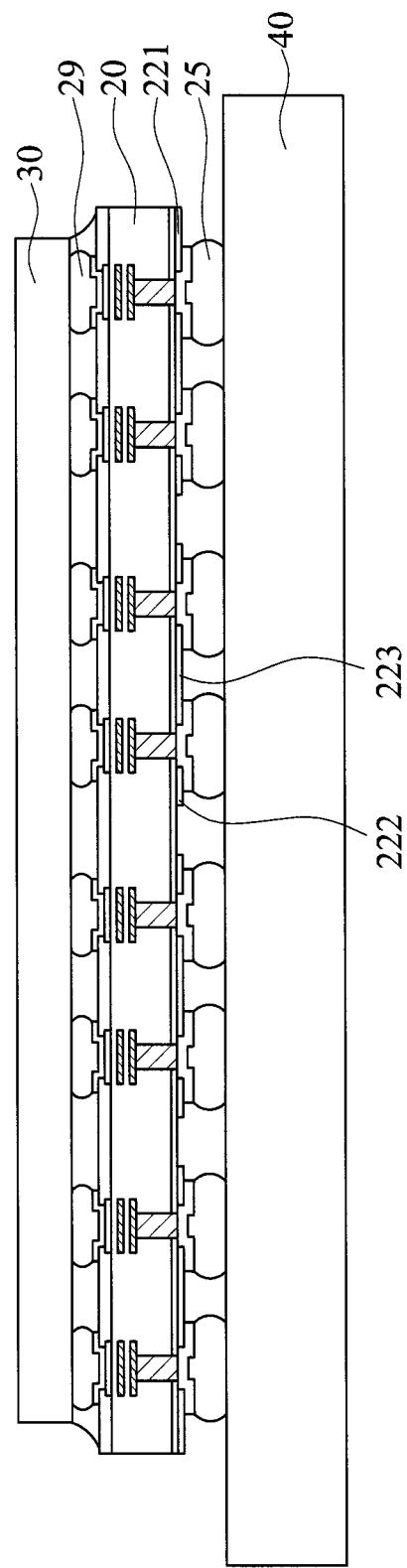
FIG. 4 is a schematic cross-sectional view of a package structure of the present invention.

FIG. 4 is a schematic cross-sectional view of a package structure of the present invention. Referring to FIG. 4, the package structure has a semiconductor interposer as described above. The semiconductor interposer has: a substrate body 20 having opposite first and second surfaces 20a, 20b, wherein an inner area 201 and a peripheral area 202 around the inner area 201 are defined on the second surface 20b of the substrate body 20; a plurality of conductive posts 21 embedded in the substrate body 20 and each having one end exposed from the second surface 20b of the substrate body 20; a passivation layer 22 formed on the second surface 20b of the substrate body 20, wherein the passivation layer 22 has a peripheral portion 221 formed in the peripheral area 202 of the substrate body 20, a plurality of ring-shaped portions 222 formed around peripheries of the exposed ends of the conductive posts 21 in the inner area 201 of the substrate body 20 and a plurality of strip-shaped portions 223 formed between the ring-shaped portions 222 for connecting the ring-shaped portions 222; and a UBM layer 23 formed on the exposed end of each of the conductive posts 21 and extending on the ring-shaped portion 222 around the periphery of the exposed end of the conductive post 21. The package structure further has a first electronic element 30 disposed on the first surface 20a of the substrate body 20 and a second electronic element 40 disposed on the second surface 20b of the substrate body 20 through the UBM layer 23.

In the present embodiment, the first electronic element 30 is a chip and the second electronic element 40 is a carrier. In another embodiment, the first electronic element 30 can be a carrier and the second electronic element 40 can be a chip.

Therefore, by forming a peripheral portion in the peripheral area of the semiconductor interposer that generally experiences large stresses and forming ring-shaped portions and strip-shaped portions in the inner area of the semiconductor interposer that generally experiences small stresses, the present invention effectively reduces stresses so as to prevent warping of the semiconductor interposer. Also, the ring-shaped portion effectively reduces the bonding stress between the UBM layer and the substrate body so as to prevent delamination of the UBM layer or cracking of the conductive element on the UBM layer, especially when the outer edge of the ring-shaped portion extends 8 to 12 um beyond the outer edge of the UBM layer on the ring-shaped portion.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A semiconductor interposer, comprising:
   a substrate body having opposite first and second surfaces, wherein an inner area and a peripheral area around the inner area are defined on the second surface of the substrate body;
   a plurality of conductive posts embedded in the substrate body and each having one end exposed from the second surface of the substrate body;
   a passivation layer formed on the second surface of the substrate body, wherein the passivation layer has a peripheral portion formed in the peripheral area of the substrate body, a plurality of ring-shaped portions formed around peripheries of the exposed ends of the conductive posts in the inner area of the substrate body and a plurality of strip-shaped portions formed between the ring-shaped portions for connecting the ring-shaped portions; and
   a UBM (Under Bump Metallurgy) layer formed on the exposed end of each of the conductive posts and extending onto the ring-shaped portion around the periphery of the exposed end of the conductive post.

2. The interposer of claim 1, wherein the number of the strip-shaped portions of the passivation layer is 2(n+1) such that the strip-shaped portions are arranged into a plurality of polygons, n being a positive integer greater than zero.

3. The interposer of claim 2, wherein the polygons have a same size.

4. The interposer of claim 2, wherein n is in a range of 1 to 20.

5. The interposer of claim 2, wherein the polygons are in connection with one another to form a mesh pattern.

6. The interposer of claim 2, wherein adjacent polygons only share one ring-shaped portion such that the polygons are connected in series.

7. The interposer of claim 6, wherein the polygons are arranged in an alternate staggering pattern.

8. The interposer of claim 2, wherein the strip-shaped portions are arranged into a plurality of regular hexagons, each of the regular hexagons being comprised of at least six of the strip-shaped portions.

9. The interposer of claim 1, further comprising a surface passivation layer formed on the second surface of the substrate body and positioned between the passivation layer and the substrate body.

10. The interposer of claim 9, wherein the surface passivation layer is formed on the entire second surface of the substrate body and a portion of the surface passivation layer around the periphery of the exposed end of each of the conductive posts is exposed from the ring-shaped portion of the passivation layer such that the UBM layer is further formed on the exposed portion of the surface passivation layer.

11. The interposer of claim 9, wherein the surface passivation layer is made of an inorganic material.

12. The interposer of claim 1, wherein the passivation layer is made of a polymer material.

13. The interposer of claim 1, wherein an outer edge of the ring-shaped portion extends 8 to 12 um beyond an outer edge of the UBM layer on the ring-shaped portion.

14. A package structure, comprising:
a semiconductor interposer, comprising:
   a substrate body having opposite first and second surfaces, wherein an inner area and a peripheral area around the inner area are defined on the second surface of the substrate body;
   a plurality of conductive posts embedded in the substrate body and each having one end exposed from the second surface of the substrate body;
   a passivation layer formed on the second surface of the substrate body, wherein the passivation layer has a peripheral portion formed in the peripheral area of the substrate body, a plurality of ring-shaped portions formed around peripheries of the exposed ends of the conductive posts in the inner area of the substrate body and a plurality of strip-shaped portions formed between the ring-shaped portions for connecting the ring-shaped portions; and
   a UBM layer formed on the exposed end of each of the conductive posts and extending onto the ring-shaped portion around the periphery of the exposed end of the conductive post;
a first electronic element disposed on the first surface of the substrate body; and
a second electronic element disposed on the second surface of the substrate body through the UBM layer.

15. The structure of claim 14, wherein the first electronic element is a chip and the second electronic element is a carrier.

16. The structure of claim 14, wherein the number of the strip-shaped portions of the passivation layer is 2(n+1) such that the strip-shaped portions are arranged into a plurality of polygons, n being a positive integer greater than zero.

17. The structure of claim 16, wherein the polygons have a same size.

18. The structure of claim 16, wherein n is in a range of 1 to 20.

19. The structure of claim 16, wherein the polygons are in connection with one another to form a mesh pattern.

20. The structure of claim 16, wherein adjacent polygons only share one ring-shaped portion such that the polygons are connected in series.

21. The structure of claim 20, wherein the polygons are arranged in an alternate staggering pattern.

22. The structure of claim 16, wherein the strip-shaped portions are arranged into a plurality of regular hexagons, each of the regular hexagons being comprised of at least six of the strip-shaped portions.

23. The structure of claim 14, further comprising a surface passivation layer formed on the second surface of the substrate body and positioned between the passivation layer and the substrate body.

24. The structure of claim 23, wherein the surface passivation layer is formed on the entire second surface of the substrate body and a portion of the surface passivation layer around the periphery of the exposed end of each of the conductive posts is exposed from the ring-shaped portion of the passivation layer such that the UBM layer is further formed on the exposed portion of the surface passivation layer.

25. The structure of claim 23, wherein the surface passivation layer is made of an inorganic material.

26. The structure of claim 14, wherein the passivation layer is made of a polymer material.

27. The structure of claim 14, wherein an outer edge of the ring-shaped portion extends 8 to 12 um beyond an outer edge of the UBM layer on the ring-shaped portion.

* * * * *